United States Patent [19]

Plunkett

[11] 4,090,142

[45] May 16, 1978

[54] AUTOMATIC FREQUENCY RESPONSE PLOTTING SYSTEM

[75] Inventor: Bradley J. Plunkett, Van Nuys, Calif.

[73] Assignee: United Recording Electronic Industries, North Hollywood, Calif.

[21] Appl. No.: 649,430

[22] Filed: Jan. 15, 1976

[51] Int. Cl.² .............................................. H03B 3/04
[52] U.S. Cl. .................................. 328/132; 328/145; 324/57 R
[58] Field of Search ......................... 324/57 R, 57 SS; 328/132, 145, 119; 235/151, 150.1; 307/229

[56] References Cited

U.S. PATENT DOCUMENTS

| 2,970,258 | 1/1961 | Sinclair | 324/57 |
| 3,612,993 | 10/1971 | Tims | 324/57 |
| 3,750,036 | 7/1973 | Burrows et al. | 328/151 |

*Primary Examiner*—Stanley D. Miller, Jr.
*Assistant Examiner*—B. P. Davis

*Attorney, Agent, or Firm*—Lindenberg, Freilich, Hornbaker, Wasserman, Rosen & Fernandez

[57] ABSTRACT

An automatic frequency response plotting system includes control circuitry for controlling the sweep rate during the plotting operation as a function of rapid changes in the amplitude of the output of the device under test. The control circuitry senses the rate of change of the amplitude of the output of a device, which is supplied with a constant amplitude signal at a frequency which is variable at a sweep rate initially selected by an operator. When the rate of change of the amplitude of the output of the device exceeds a selected level the control circuitry automatically slows down the sweep rate until the amplitude rate of change falls below the selected level, when the normal sweep rate is automatically resumed. By reducing the sweep rate during rapid amplitude changes the plotter is able to accurately trace steep amplitude excursions, thus preventing unsuspected sharp dips or peaks in the response from being missed or minimized.

11 Claims, 2 Drawing Figures

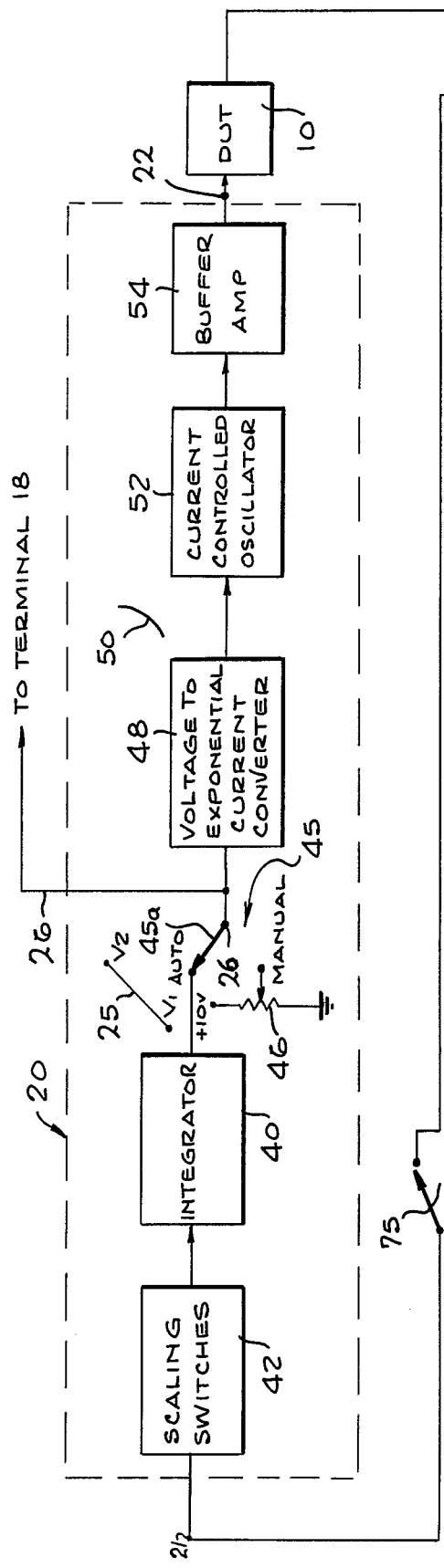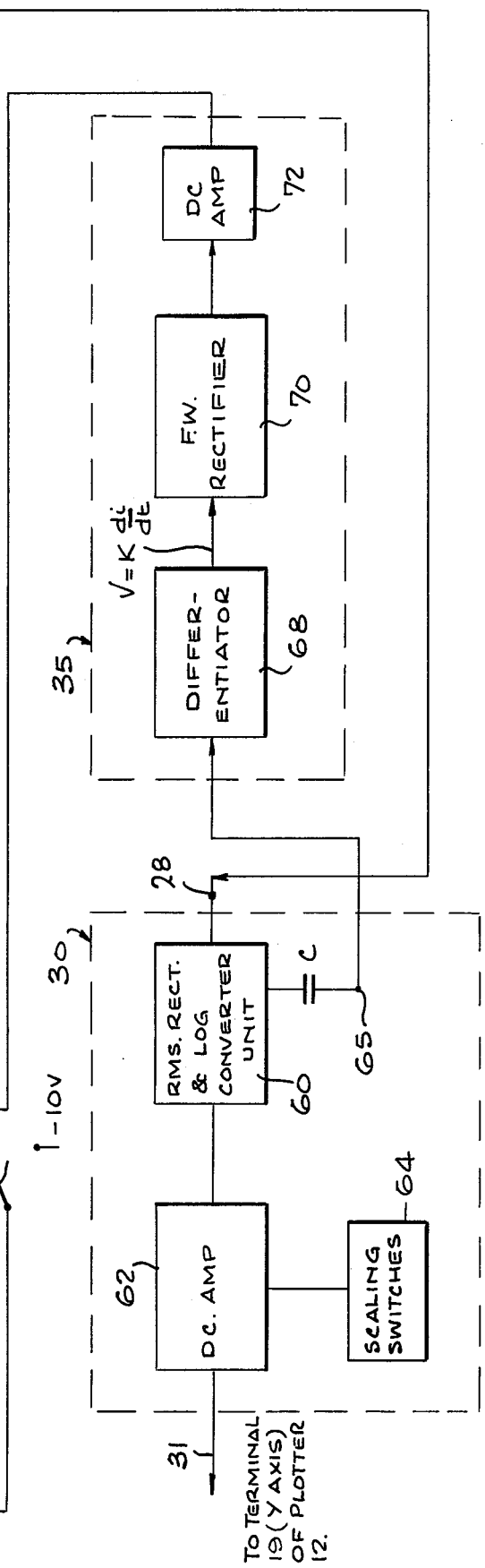
FIG. 2

AUTOMATIC FREQUENCY RESPONSE PLOTTING SYSTEM

BACKGROUND OF THE INVENTION

1. Field of the Invention

The present invention relates generally to an automatic frequency response plotting system and, more particularly, to improvements in circuitry in such a system.

2. Description of the Prior Art

Frequency response plotting systems are presently available which are capable of producing a plot of the frequency response of a device under test, e.g., a speaker, amplifier or filtering network over a selected frequency range. The plot is produced by an XY-plotter which includes a pen which is mechanically movable along the X-axis, along which frequency is represented on the plot, as well as along the Y-axis along which the response of the device under test is plotted as a function of frequency. Typically, the system circuitry includes a send section which includes a voltage ramp generator which generates a voltage which ramps from a first level to a second higher level at a controllable rate. This ramp voltage is used to control the pen movement along the X-axis of the plotter from one end of the desired plot to the other end. Also, the ramp voltage is used to activate a frequency oscillator which is swept in frequency over the range of interest, e.g., 20Hz to 20KHz, when plotting the response of a device operable in the audio range. The output of the oscillator is supplied to an amplifier whose output is constant over the frequency range of interest. It is this output which is applied to the device under test. The ramp voltage activates the oscillator so that at each position of the plotter pen along the X-axis the oscillator frequency corresponds to the frequency designated on the plot at the particular X-axis position of the pen.

The circuitry also includes a receiver section which responds to the output of the device under test to which the constant amplitude variable frequency signal is applied as an input from the send section output amplifier. The receiver section includes means which rectify the AC output of the device under test and uses the rectified output to control the pen position along the Y-axis of the plotter.

The mechanism used to move the pen along the X and Y axes are mechanical in nature and therefore of limited response. Consequently, whenever the device under test is known or suspected of exhibiting significantly large changes in response as a function of small frequency variations, which would result in steep amplitude excursions along the Y-axis, a very low sweep rate must be employed to enable the pen driving mechanism to respond to the large changes in the device's output so as to move the pen in the Y-axis to produce the steep amplitude excursions without distortion.

In the prior art the sweep rate is not changed during the response plotting as a function of changes in the rate of change of the device's output. If the device to be tested is known or suspected of having a complex response pattern, which would result in steep amplitude excursions in the plot over the entire frequency range, or over any portion or portions thereof, a very slow sweep rate is recommended, which increases the plotting time. On the other hand, if the device under test is expected to have a relatively uniform response over the entire range of interest, i.e., its output is expected to vary gradually as a function of frequency change, a high sweep rate may be employed. If however, the device output exhibits unsuspected steep amplitude changes, such as sharp dips or peaks, and the system is operating at a high sweep rate, because of the limited ability of the plotter mechanism to respond to the steep amplitude changes, they are missed or greatly minimized, thus resulting in a distorted or inaccurate response plot.

OBJECTS AND SUMMARY OF THE INVENTION

An object of the present invention is to provide circuitry for use in a frequency response plotting system in which accurate tracing of steep amplitude excursions is achieved without the necessity of using very slow sweep rates, over the entire frequency range.

Another object of the present invention is to provide novel and improved circuitry for use in a frequency response plotting system.

Still another object of this invention is the provision of a novel frequency response plotting system which can plot a complex or irregular frequency response curve in less time than with presently known instruments.

These and other objects of the invention are achieved by incorporating circuitry which senses the rate of change of the amplitude of the output signal of the device under test. As long as the rate of amplitude change is below a selected rate level a relatively high frequency sweep rate is employed. However, when rapid amplitude changes are encountered the circuitry automatically slows down the sweep rate, causing normal sweep rate to be resumed following such excursions. With the novel circuitry even with a relatively high sweep rate, unsuspected sharp dips or peaks in the desired plot are not missed nor minimized.

The novel features of the invention are set forth with particularity in the appended claims. The invention will best be understood from the following description when read in conjunction with the accompanying drawings.

BRIEF DESCRIPTION OF THE DRAWINGS

FIG. 2 is a more detailed block diagram of the circuitry including the present invention.

DESCRIPTION OF THE PREFERRED EMBODIMENTS

Figure 1:
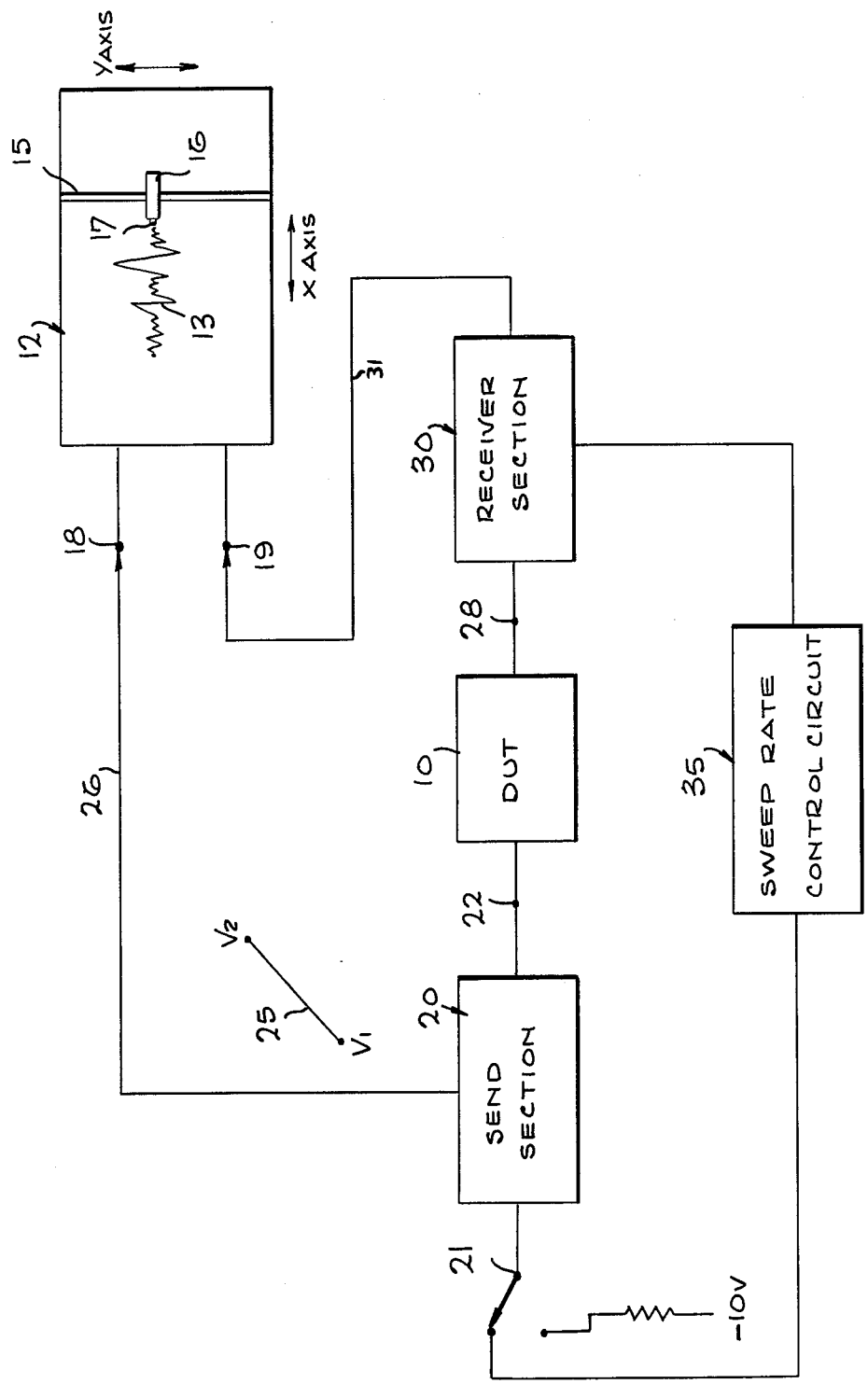
FIG. 1 is a simplified block diagram of an automatic frequency response plotting system, incorporating the present invention.

Attention is first directed to FIG. 1 which is a simplified block diagram of a frequency response plotting system incorporating the present invention. For explanatory purposes it is assumed that the response of a device under test (DUT) 10 to frequencies in the audio range, e.g., 20Hz–20KHz to be plotted by an XY-plotter 12. Such plotters are available from various commercial sources, e.g., Hewlett-Packard Co., of California. The conventional plotter designed to produce a plot 13 includes a movable member 15 on which a pen support arm 16 is slideably mounted. The pen is designated by numeral 17.

In operation the member 15 is movable along the plotter's X-axis so as to position the pen 17 at a position along the X-axis which is directly dependent on the amplitude of DC voltage applied to the plotter's X-axis input terminal 18. The arm 16 is slideable on member 15 so as to position the pen at a position along the Y-axis which is directly dependent on the amplitude of a DC voltage applied to the plotter's Y-axis input terminal 19. The XY-plot 13 is produced by the pen 17 on paper, appropriately positioned on the plotter's surface with which the pen comes in contact.

The response plotting system is shown to include a send section 20, with an input terminal 21 and an output terminal 22 to which the send section output is applied as the input to DUT 10. In a conventional send section a signal of a preselected constant amplitude, e.g., $-10v$ is applied to the input terminal 21. In response thereto a ramp DC voltage is generated. In FIG. 1 the ramp voltage is designated by 25 and is shown to vary from a low voltage level $V_1$ to a higher voltage level $V_2$. This ramp voltage is supplied via line 26 to the plotter's X-axis input terminal 18, thereby causing the member 15 and therefore pen 17 to move along the X-axis. $V_1$ and $V_2$ are chosen so that as the voltage 25 changes between these two levels the pen moves along the X-axis from one end of the desired plot 13 to the other.

Within the send section 20 the ramp voltage 25 is utilized to sweep a variable frequency oscillator whose output frequency is made to vary, i.e., is swept over the frequency range of interest, e.g., 20Hz–20KHz as the voltage 25 changes from $V_1$ to $V_2$. The output of the oscillator is applied to a linear amplifier whose output is of constant amplitude over the range of frequencies provided by the oscillator. The amplifier's output is applied to terminal 22 as the input to DUT 10. In the send section 20 the oscillator is swept by voltage 25 so that at each position of the pen along the X-axis the oscillator's output frequency corresponds to that designated on the paper on which plot 13 is plotted at the particular X-axis position of the pen.

The DUT 10, in response to the signal at terminal 22, produces an output signal at its output terminal 28 which is applied to the receiver section 30 of the system. The frequency of the DUT 10 output signal is the same as its input signal frequency. However, its output signal amplitude depends on the frequency response characteristics of the DUT 10. The receiver section 30 basically rectifies the AC signal at terminal 28, which is the DUT output signal, and converts it to a DC voltage whose amplitude is related to the amplitude of the DUT output signal. The DC voltage from section 30 is applied via line 31 to the plotter's input terminal 19, thereby controlling the Y position of the pen at each frequency, as a function of the amplitude of the DUT's output signal at each frequency in the range of interest.

In the prior art the amplitude of the input signal which is applied to the send section 20 at input terminal 21 is made constant. Section 20 generally includes means which enable an operator, prior to producing a response plot, to select a selected voltage ramping rate, which in turn controls the frequency sweep rate. That is, the operator can select the time interval in which the voltage 25 will ramp between levels $V_1$ and $V_2$ thereby controlling the sweep rate and the total time required to produce the plot 13. However, once the desired sweep rate is selected it remains constant during the plotting operation and is completely independent of the rate of change of the amplitude of the DUT's output signal. Thus, the initially selected amplitude of the input signal at terminal 21 can be thought of as controlling, i.e., selecting the initial sweep rate. For this reason, the input signal to terminal 21 can be thought of as the control signal which controls the sweep rate and terminal 21 can be thought of as the control terminal of the send section 20.

The disadvantages of maintaining a constant sweep rate during the plotting of a response plot have been discussed above. Briefly, if a high sweep rate is chosen and unexpected rapid amplitude changes in the DUT output are encountered, the result is rapid changes in the DC voltage output of the receiver section 30 which is supplied to the plotter 12 at terminal 19. Since in the plotter 12 mechanical means are used to move the pen in the Y-axis these means are not able to respond to such rapid changes. Consequently, the pen's excursions along the Y-axis do not correspond to the changes in the DC voltage applied at terminal 19, resulting in minimized and often missed sharp dips or peaks in the final plot. Also, some plot inaccuracies may result due to slow response time of the rectifier in the receiver section to rapid changes in the amplitude of the DUT output signal. Hereinbefore, the minimization of the loss of such peaks could only be achieved by resorting to using a very slow sweep rate. However, this is undesirable since it increases the time required to produce the desired plot. Also, heretofore, in order to insure that no frequency response characteristic of the DUT 10 would be missed a number of reruns of the frequency test of the apparatus would be made at several different sweep rates.

These disadvantages are eliminated by the present invention which incorporates a sweep rate control circuit 35, which is connected between the receiver section 30 and the send section 20. Briefly, circuit 35 senses the rate of change of the amplitude of the DUT output signal, which is supplied to the receiver section 30. In one embodiment of the circuit 35 as long as the rate of change of the amplitude of the DUT output signal is below a selected rate level the circuit 35 applies a constant voltage to input terminal 21 of the send section 20. Consequently, the sweep rate is not altered from that initially selected by the operator prior to the start of the plotting operation. However, if during the plotting operation the rate of change of the amplitude of the DUT output signal exceeds a selected rate level, the control circuit 35 reduces the input voltage to the send section 20, thereby reducing the operator-selected sweep rate, so as to enable the changes in the pen position in the Y-axis to be directly related to the changes in the DC output voltage of the receiver section. Thus, unsuspected sharp dips or peaks in the response plot are accurately traced by the pen.

Once the rate of change of the DUT output signal amplitude decreases and is no longer above the selected rate the input voltage to the send section 20 from circuit 35 returns to that provided at the start of the operation. Consequently, the originally selected sweep rate is automatically re-established. It should thus be apparent that with the control circuit 35 a relatively high sweep rate can be selected initially. Upon encountering rapid amplitude changes in the DUT output the sweep rate is automatically reduced, with the initially selected sweep rate being automatically resumed following the rapid changes in the amplitude of the DUT output signal.

Attention is now directed to FIG. 2 in which one embodiment of the send section 20, the receiver section 30 and the novel control circuit 35 is shown in block form. The particular embodiment is for producing the response plot 13 on multicycle semi-log paper in which the logarithm scale is along the X-axis with frequency being designated therealong. A linear scale is along the Y-axis with the response amplitude being represented in dBs.

The send section 20 includes an integrator 40 which is connected to the input terminal 21 through scaling switches 42. The output of the integrator 40 is the ramp voltage 25 which ramps between levels $V_1$ and $V_2$. In one embodiment $V_1 = 0$ volt and $V_2 = 7.5$ volts. The scaling switches which are connected between the input terminal 21 and integrator 40 are used by an operator to select the ramp rate of the ramp voltage 25. With a constant amplitude input at terminal 21, e.g., $-10V$, the switches 42, which are assumed to include a vernier potentiometer, are used to select any ramp rate from 15 seconds to 20 minutes. However, once the desired ramp rate is chosen using the switches 42 prior to the start of the plotting operation, the switches remain in the selected setting. Thus, the ramp rate does not change except due to changes in the amplitude of the input at terminal 21.

The ramping voltage 25 from integrator 40 is supplied to a two position AUTO-MANUAL switch 45, which is shown with its wiper 45a connected to the AUTO terminal to which the integrator output is applied. The switch 45 is in the AUTO position, as shown, during the automatic plotting operation. It is moved to the MANUAL position in which the wiper 45a is connected to the wiper arm of a potentiometer 46 which is connected between +10V and ground only for manual operation.

The voltage on the switch wiper 45a is supplied via line 26 to the X-axis terminal 18 of plotter 12, thereby controlling the X-position of the pen. It is also supplied to a voltage to exponential current converter 48. The converter 48 effectively produces an output current, represented by 50, which is the exponential function of its input voltage from wiper 45a. The converter's output current is applied to a current controlled oscillator 52 which generates the 20Hz to 20KHz sweep. The converter 48 is required since in the plot 13 frequency is represented on the logarithmic scale along the X-axis. The output of the oscillator 52 is applied to a linear buffer amplifier 54 whose AC output is of constant amplitude over the range of frequencies applied thereto from oscillator 52. The output of buffer amplifier is applied to output terminal 22 to which the DUT 10 is connected.

The output of DUT 10 is connected to terminal 28, to which the receiver station 30 is connected. It includes an RMS rectifier and logarithmic converter unit 60 to which the DUT output at terminal 28 is applied. Since the DUT output is an AC voltage, unit 60 measures the RMS value of the DUT output, takes the logarithm of it and converts it to a DC output voltage whose amplitude is proportional to the logarithm of the measured RMS value of the DUT output. The logarithmic conversion is performed, since the scale along the Y-axis is linear and the response is to be plotted in decibels.

The DC output of unit 60 is applied to a DC amplifier 62, whose DC output voltage is connected via line 31 to terminal 19 of the plotter 12. It is this voltage at terminal 19 that controls the pen position along the Y-axis. Scaling switches 64 are used to control the gain of amplifier 62 and thereby control the number of dB, represented in the plot per unit length, e.g., 1dB/inch, 2dB/inch, etc.

The receiver section 30 as hereinbefore described is very similar to prior art receiver sections, performing similar functions in an automatic response plotting system, except for one very significant aspect. Every conventional RMS rectifier includes a filter capacitor, one end of which is typically grounded to system ground. For explanatory purposes in FIG. 2 the filter capacitor is shown outside unit 60 and is designated by C with its end, which is conventionally grounded, designated by 65. One example of such an RMS rectifier and logarithmic converter is model 207 manufactured by dbx INC., of Waltham, Mass. Unlike the prior art, in accordance with the present invention, the end 65 of the filter capacitor C is not grounded but rather is connected to a differentiator 68 which together with a full-wave rectifier 70 and a DC amplifier 72 form the control circuit 35, whose function has been described hereinbefore.

As is appreciated by those familiar with the art the ripple current in the capacitor C, i.e., the change of current therethrough is proportional to the rate of change of the amplitude of the voltage at terminal 28 which is applied to the RMS rectifier for rectification. If the change in amplitude is gradual, the change of current through the capacitor is gradual. On the other hand, if the change in amplitude is rapid the current through the capacitor changes rapidly. In a response plotting system to which the present invention is primarily directed, rapid changes in the amplitude of the voltage applied to unit 60 will occur if an initially relatively high sweep rate is selected by means of switches 42, and the DUT 10 response changes rapidly as a function of small changes in frequency at one or more portions of the frequency range of interest.

In accordance with the present invention the end 65 of capacitor C rather than being directly grounded, as is done in the prior art, is ground through the differentiator 68, without affecting the performance of the RMS rectifier. However, by so grounding the filter capacitor C, the differentiator senses the rate of change of current through the filter capacitor C, and produces an output voltage, which is proportional to the rate of change of current through the capacitor, as designated in FIG. 2 by $V = K(d_i/d_t)$, where K is proportionately constant.

It should be pointed out that while the amplitude of the voltage out of the differentiator 68 is proportional to the rate of current change through the capacitor C, its polarity depends on the direction of current change. However, in the present invention only the rate of current change is of interest, i.e., the amplitude of the voltage out of the differentiator 68. For this reason the output voltage from the differentiator is rectified by the full-wave rectifier 70 whose output voltage is unipolar. It is supplied to the DC amplifier 72 whose output is in turn applied as the input to the send section 20 at terminal 21.

In operation, the DC amplifier is designed to provide a selected output voltage, e.g., $-10V$, to terminal 21 when the differentiator output is 0 volt and thereof the input to amplifier 72 from rectifier 70 is 0 volt. This is the case prior to the start of a plotting operation. Thus, with $-10V$ output from amplifier 72, the input to the switches 42 is the same as if the wiper of switch 75 were connected to a terminal to which $-10V$ is applied from a constant source, rather than to the output of amplifier 72. With the constant input of $-10V$ the sweep rate is selected by the operator by means of switches 42, as hereinbefore described.

As plotting commences and the response of DUT 10 varies due to changes in frequency, i.e., the amplitude of its output at terminal 28 changes with frequency, the rate of change of current through the capacitor C varies, depending on the response characteristics of DUT 10. Consequently, the voltage applied to amplifier 72 through rectifier 70 from differentiator 68 is no longer 0 volt. Rather, it depends on the rate of change of current through the capacitor C, which is dependent on the rate of change of the amplitude of the voltage from DUT 10. As the amplitude of the voltage applied to amplifier 72 increases from 0 volt, its output voltage increases, i.e., becomes less negative than −10V which is assumed to be its output with 0V input from rectifier 70. Consequently, the input at terminal 21 is no longer −10V. As it increases, i.e., becomes less negative, even with the constant setting of switchs 42 the previously selected sweep rate is automatically reduced thereby automatically reducing the rate at which the frequency changes. It in turn reduces the rate of change of the amplitude of the output of the DUT 10, thereby enabling the plotter 12 to respond to the changes applied to its Y-axis terminal 19 and cause the pen 17 to be moved in the Y-axis in a manner directly related to changes in the DUT output amplitude changes. As a result, large dips or peaks due to rapid amplitude changes of the DUT output are not missed nor minimized.

If desired the control circuit 35 may be designed so that the automatic reduction of the sweep rate is directly related to the increase of the rate of change of the DUT output amplitude. Thus, whenever the output of the differentiator 68 is other than 0V the output of the amplifier 72 becomes less negative and increases toward 0V (from −10V), thereby reducing the sweep rate by a factor related to the voltage from the differentiator 68. However, most XY-plotters have a reasonably fast response time. Therefore, it has been found that in order not to miss or minimize sharp dips or peaks in the plot it is necessary to reduce the sweep rate only when the rate of change of the DUT output amplitude exceeds values which the plotter cannot respond to. Thus, in an embodiment which was actually reduced to practice amplifier 72 is designed to maintain an output of −10V as long as the rectified voltage from the differentiator 68 does not exceed a selected amplitude, corresponding to a specific rate of change of current through the filter capacitor C, which in turn corresponds to a specific rate of change of the DUT output amplitude, to which the plotter can respond without plot distortion. If, however, the actual rate of change of the DUT output amplitude exceeds the specific rate of change, i.e., the rectified voltage from differentiator 68 exceeds the selected amplitude, only then does the amplifier 72 output increase (become less negative), thereby decreasing the sweep rate. As is appreciated by those familiar with the art one way this can be achieved is by biasing the input to amplifier 72 so that as long as the rectified voltage from rectifier 70 does not exceed a selected voltage the output of the amplifier 72 remains constant at −10V. However, when the voltage from rectifier 70 exceeds the selected voltage the output of amplifier 72 becomes less negative by an amount directly related to the amplitude of the voltage from rectifier 70 above the selected voltage.

From the foregoing it should thus be appreciated that unlike the prior art in which sweep rate, once established prior to a plotting operation, is not dependent on changes in the DUT output amplitude, in accordance with the present invention such dependency does exist, and is achieved by means of the sweep rate control circuit 35. In accordance with the present invention by incorporating the control circuit 35 in the circuitry of the automatic response plotting system the initially selected sweep rate, which can be thought of as the normal sweep rate, is automatically slowed down when rapid changes in the amplitude of the DUT output are encountered, with normal sweep rate being resumed following such rapid changes. In this way, unsuspected sharp dips or peaks in the response of the DUT are not missed nor minimized, since by reducing the sweep rate when rapid amplitude changes are encountered the rate of amplitude change is effectively decreased, thereby enabling the plotter pen to accurately trace steep amplitude excursions. As previously pointed out the automatic slowing down of the sweep rate may take place only when the rate of amplitude changes exceeds a selected rate level which is the case when the output of amplifier 72 starts becoming less negative when the rectified voltage applied thereto exceeds a selected level. However, if desired the automatic slowing down of the sweep rate may be made directly dependent on any rate of change of the DUT output amplitude, rather than limiting it to those instances when the amplitude rate of change exceeds a selected level.

Although particular embodiments of the invention have been described and illustrated herein, it is recognized that modifications and variations may readily occur to those skilled in the art and consequently, it is intended that the claims be interpreted to cover such modifications and equivalents.

The embodiments of the invention in which an exclusive property or privilege is claimed are defined as follows:

1. For use with a first circuit of the type providing an AC output signal at a constant amplitude and a frequency variable at a selected sweep rate, and with a second circuit of the type adapted to receive an AC signal at a variable amplitude, an arrangement comprising:

first control means coupled to said second circuit and responsive to the amplitude of the AC signal, received by said second circuit, for providing a first signal which is a function of the rate of change of the amplitude of the AC signal received by said second circuit; and second control means coupled to said first control means and to said first circuit for controlling the sweep rate of the frequency of the AC signal provided by said first circuit, as a function of said first signal.

2. The arrangement as described in claim 1 wherein said first circuit includes a control terminal, with the selected sweep rate being a function of a selected amplitude of a control signal at said control terminal, and said second control means being connected to said control terminal for varying the amplitude of the control signal at said control terminal as a function of the amplitude of said first signal which is a function of the rate of change of the amplitude of the AC signal received by said second circuit.

3. The arrangement as described in claim 2 wherein said second control means include means to vary said control signal amplitude from said selected amplitude so as to slow down said sweep rate when the amplitude of said first signal changes in a direction which indicates an increase in the rate of change of the amplitude of the signal received by said second circuit.

4. The arrangement as described in claim 3 wherein said second control means include means which vary the amplitude of the control signal at said control terminal from said selected amplitude only when the amplitude of the first signal from said first control means reaches a level which indicates that the amplitude of the AC signal received by said second circuit varies at a rate above a preselected rate of amplitude change.

5. The arrangement as described in claim 3 wherein said first control means includes differentiator and rectifying means for providing said first signal, which is a unipolar signal, whose amplitude is directly related to the rate of change of the amplitude of the AC signal received by said second circuit, and said second control means includes amplifier means, to which said unipolar first signal is applied for providing the control signal to said control terminal of said first circuit at an amplitude which is a function of the amplitude of said unipolar first signal.

6. The arrangement as described in claim 3 wherein said first control means includes differentiator and rectifying means for providing said first signal which is a unipolar signal, whose amplitude is directly related to the rate of change of the amplitude of the AC signal, received by said second means, and said second control means includes amplifier means to which said unipolar first signal is applied, for providing the control signal to said control terminal of said first circuit at said selected amplitude as long as the amplitude of said unipolar first signal is not less than a selected level, and for varying the amplitude of the control signal from said selected amplitude so as to reduce said sweep rate, when the unipolar first signal amplitude exceeds said selected level.

7. For use in a frequency response detection system of the type designed to detect the frequency response of a device under test over a preselected frequency range, the arrangement comprising:

first circuit means having a control terminal for providing an AC output signal at a substantially constant amplitude and at a frequency which is variable at a selected sweep rate which is a function of the amplitude of a control signal applied to said control terminal, the output signal being suppliable to a device under test whose frequency response is to be detected;

second circuit means adapted to respond to an AC signal from said device, the AC signal amplitude being a function of the frequency response characteristics of said device, for providing an output signal which is a function of the amplitude of the AC signal from said device; and third circuit means connected to said first and second circuit means and responsive to the AC signal from said device, received by said second means, for sensing the rate of change of the amplitude of the signal from said device and for controlling the amplitude of the control signal at the control terminal of said first circuit means as a function of the rate of change of the amplitude of the signal from said device.

8. The arrangement as described in claim 7 wherein said third circuit means include means to vary the amplitude of the control signal at the control terminal of said first circuit means, from a preselected amplitude at which said frequency varies at said selected sweep rate, so as to reduce said sweep rate from said selected sweep rate as a function of the rate of change of the amplitude of the signal from said device.

9. The arrangement as described in claim 8 wherein said third circuit means includes differentiator and rectifying means for providing a unipolar signal whose amplitude is directly related to the rate of change of the amplitude of the signal received by said second circuit means, and amplifier means to which said unipolar signal is applied for providing the control signal to said control terminal of said first circuit means at an amplitude which is a function of the amplitude of said unipolar signal.

10. The arrangement as described in claim 7 wherein said third circuit means include means to vary the amplitude of the control signal at the control terminal of said first circuit means from a preselected amplitude at which said frequency varies at said selected sweep rate, to reduce said sweep rate from said selected sweep rate only when the rate of change of the amplitude of the signal from said device exceeds a preselected rate of change.

11. The arrangement as described in claim 10 wherein said third circuit means includes differentiator and rectifying means for providing a unipolar signal whose amplitude is directly related to the rate of change of the amplitude of the signal received by said second circuit means from said device, and amplifier means to which said unipolar signal is applied for providing the control signal to said control terminal of said first circuit means at said preselected amplitude as long as the amplitude of said unipolar signal is not less than a selected level, and for varying the amplitude of the control signal from said selected amplitude so as to reduce said sweep rate, when the unipolar signal amplitude exceeds said selected level.

* * * * *